(12) United States Patent
Adar et al.

(10) Patent No.: US 7,067,913 B2
(45) Date of Patent: Jun. 27, 2006

(54) SEMICONDUCTOR COOLING SYSTEM AND PROCESS FOR MANUFACTURING THE SAME

(75) Inventors: Eliezer Adar, Sde Varburg (IL); Vladimir Gotlib, Natania (IL)

(73) Assignee: DTNR Ltd., Sde Varburg (IL)

( * ) Notice: Subject to any disclaimer, the term of this patent is extended or adjusted under 35 U.S.C. 154(b) by 0 days.

(21) Appl. No.: 10/917,312

(22) Filed: Aug. 13, 2004

(65) Prior Publication Data

US 2006/0033206 A1 Feb. 16, 2006

(51) Int. Cl.
*H01L 23/10* (2006.01)
*H01L 23/34* (2006.01)

(52) U.S. Cl. .................. 257/707; 257/706; 257/930; 438/122

(58) Field of Classification Search .............. 257/706, 257/707, 713, 722, 930; 438/122
See application file for complete search history.

(56) References Cited

U.S. PATENT DOCUMENTS

| | | | | |
|---|---|---|---|---|
| 5,637,921 A | * | 6/1997 | Burward-Hoy | 257/712 |
| 6,249,434 B1 | * | 6/2001 | Scafidi | 361/704 |
| 6,667,548 B1 | * | 12/2003 | O'Connor et al. | 257/712 |
| 6,727,422 B1 | * | 4/2004 | Macris | 136/201 |
| 6,748,350 B1 | * | 6/2004 | Rumer et al. | 703/9 |

* cited by examiner

*Primary Examiner*—S. V. Clark
(74) *Attorney, Agent, or Firm*—Oblon, Spivak, McClelland, Maier & Neustadt, P.C.

(57) ABSTRACT

A cooling device for an element such as a microprocessor in a computer, and a process for manufacturing the cooling device. The cooling device provides an effective structure of cooling a microprocessor by providing a metallic filler layer and a metal plate layer spreading out heat generated from the microprocessor, and thereby effectively thermally conducting heat away from the microprocessor. Further, a semiconductor thermoelectric module can be utilized to further cool the microprocessor.

40 Claims, 3 Drawing Sheets

SEMICONDUCTOR COOLING SYSTEM AND PROCESS FOR MANUFACTURING THE SAME

BACKGROUND OF THE INVENTION

1. Field of the Invention

The present invention is directed to a cooling system structure particularly well suited for cooling an element such as an integrated circuit chip, such as a microprocessor installed in a computer, and a process for manufacturing the cooling system.

2. Description of the Background Art

Adequate cooling of microprocessors in computer devices is a well known problem. The most conventional background approach to cooling a microprocessor in a computer is to attach some type of radiator structure onto a microprocessor computer chip and to use a fan to blow air across the radiator to cool the chip. However, such a background approach suffers from several problems as recognized by the present inventors.

First, such a radiator-fan system cannot provide cooling at a specified temperature regime since the temperature of the cooling system depends on environmental conditions such as ambient temperature, humidity, etc. Further, such a cooling system is often just not particularly effective as the fan predominantly blows the warm air within the computer across the radiator, and thus often adequate cooling cannot be properly realized.

Secondly, such a radiator-fan system has a drawback in that the chip to be cooled is usually of a few cubic centimeters in size and has a mass of a few grams, whereas the cooling system has a significantly greater volume and mass. With the desire to increase the miniaturization of computers, such as in a laptop computer, employing such a large cooling system prevents an adequate miniaturization of the overall device.

Thirdly, such a radiator-fan system includes many mechanical parts for driving the fan. Failure in any of those mechanical parts can result in the fan not properly operating, which obviously results in improper cooling, and which can easily result in a catastrophic breakdown of the semiconductor chip. If a semiconductor chip reaches a temperature of approximately 100° C. the chip performance may deteriorate, and if the chip reaches a temperature of approximately 130° C. that chip may cease to operate, and having a fan breakdown can result in such temperatures being reached at the chip.

Fourthly, in such a radiator-fan system the fan also brings in new air that may have moisture and dust that may coat the cooling system and eventually deteriorate and wear down components of the cooling system. Such a fan also requires a 12 volt power source, and thus such a radiator-fan system consumes a fair amount of energy, which is particularly detrimental in a laptop computer environment as it reduces battery life.

Another background cooling system may utilize water or liquid cooling systems, particularly for larger microprocessor systems. The drawbacks with such liquid cooling systems are that they also require a large amount of space and again mechanical parts to control the liquid flow.

SUMMARY OF THE INVENTION

Accordingly, one object of the present invention is to provide a novel cooling system that can overcome or minimize the above-noted drawbacks in the background art.

The novel cooling system of the present invention avoids utilizing a fan, radiator, and pump, and thus can maintain a small size and consume less energy.

Further, the novel cooling system of the present invention also does not have any moving parts and thus has increased reliability.

A further object of the present invention is to provide a novel process for forming the novel cooling system.

A more specific object of the present invention is to provide in a further embodiment a novel cooling system, and method of manufacturing the same, that utilizes a semiconductor thermoelectric module as a cooling element, and which additionally incorporates a structure to enhance operation of that semiconductor thermoelectric module.

Certain other advantages achieved with the novel cooling system and process of the present invention is that the semiconductor thermoelectric module allows fixing a specified temperature range and controlling cooling to within that range, and thus effective cooling can be realized.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
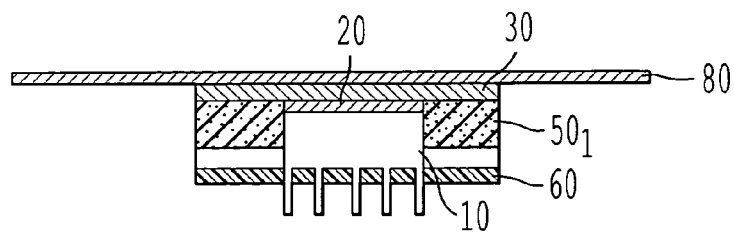
FIG. 1 shows a structure of a novel cooling system of the present invention.

Referring now to FIG. 1, a view of the novel cooling system of the present invention in one embodiment is provided.

The present invention is suited to cool any element that generates heat at a surface. The present invention is particularly applicable to cooling integrated circuit chips, for example microprocessor chips, within computers, and FIG. 1 is directed to such a non-limiting embodiment of the present invention.

As shown in FIG. 1, a microprocessor 10 is mounted on a plastic clamp 60 and is secured within a first rubber insulator $50_1$. According to features in the present invention, a first metallic filler layer 20 is formed in contact with the microprocessor 10 to completely cover a top surface of the microprocessor 10. Further, a first metal plate 30, which has a larger area than that of the first metallic filler layer 20 and the microprocessor 10, is provided in contact with the first metallic filler layer 20. In the simplest embodiment that first metal plate 30 can contact an outer surface 80 of a computer, for example surface 80 can be the outer casing of a laptop computer.

The applicants of the present invention recognized that when a microprocessor outputs heat the heat is generally not output uniformly from the top surface of the microprocessor. That is, the present inventors recognized that a top surface of a microprocessor generates small isolated hot spots where intense heat is built up, rather than having a uniform dissipation of heat from a top surface of the microprocessor. Because the heat is intense at certain areas a high degree of cooling is needed or else the certain areas with the intense heat will not be adequately cooled and the microprocessor will not operate properly or may break down.

In recognizing this characteristic of the heating of a microprocessor, the present invention utilizes the first metallic filler layer 20 to completely cover the top surface of the microprocessor 10 and to operate to spread out the heat from the smaller isolated hot spots on the upper surface of the microprocessor 10 to be more uniform.

By utilizing such a structure as shown in FIG. 1 the microprocessor 10 generates heat in small isolated hot spots, the first metallic filler layer 20 effectively spreads out that heat, and then the first metal plate 30 can dissipate that heat to an even greater area and can dissipate the heat through the outer casing 80 of the laptop.

In the present invention it is beneficial that the first metal plate 30 have a larger area than that of the first metallic filler layer 20 so that the first metal plate 30 can effectively conduct heat away from the first metallic filler layer 20. The first metal plate 30 can be anywhere between two to five times or more greater than the size and surface area of the first metallic filler layer 20. The greater the size of the first metal plate 30 the greater its heat dissipation properties.

In semiconductor applications it has been known to fill a space between a microprocessor and a radiator or cooling element with a silicon-based paste that may typically have a thermal conductivity range of 0.2–0.5 W/m° K. Otherwise, if only an air layer is provided between a microprocessor and a cooling element, as air only has a thermal conductivity of 0.025 W/m° K., effective thermal transmission cannot be realized.

Based on the recognition of the present inventors of the intense heat generated at isolated hot spots on top of the microprocessor 10, the first metallic filler layer 20 having a thermal conductivity of perhaps one hundred times greater than that of the silicon-based paste is utilized.

The first metallic filler layer 20 operates to effectively spread out the heat generated at the isolated hot spots on the top surface of the microprocessor 10. To continue that spreading out of the generated heat, the first metal plate 30 is provided in thermal conductive contact with the first metallic filler layer 20. By thermal conductive contact is meant that the noted elements can conduct heat between them, either directly or indirectly.

Figure 2A:
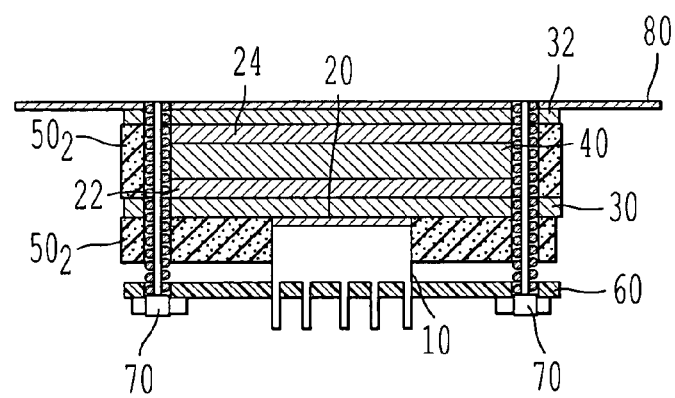
FIGS. 2(a) and 2(b) show a structure of a further embodiment of a novel cooling system of the present invention.
Figure 2B:
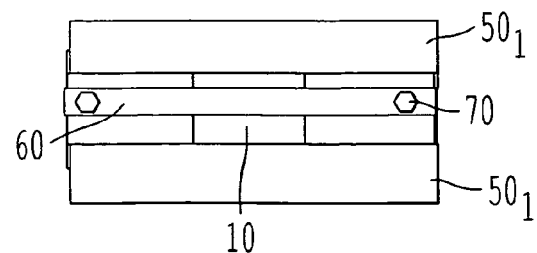

FIG. 1 shows an embodiment of the present invention in its simplest form. FIGS. 2(a) and 2(b) show a further embodiment of the present invention with even further improved heat dissipation properties by virtue of utilizing additional elements, including a semiconductor thermoelectric module, as now discussed.

As shown in FIGS. 2(a) and 2(b), in this further embodiment, an integrated circuit chip microprocessor 10 is provided as an element that generates heat, and which is desired to be cooled. As shown in FIGS. 2(a) and 2(b), FIG. 2(b) showing a bottom view of FIG. 2(a), the microprocessor 10 is mounted on plastic clamp 60 and is secured within the first rubber insulator $50_1$. The overall device is held together by pins 70 extending through the first rubber insulator $50_1$, and the plastic clamp 60.

As the main cooling element in the device of FIGS. 2(a), 2(b), a semiconductor thermoelectric module 40 is provided, surrounded by a second rubber insulator $50_2$. That element is a well known Peltier element that can receive a current supplied from the source of the direct current (12V source) located inside the computer. The semiconductor thermoelectric module 40 can be any type of conventional thermoelectric cooling device such as an UltraTech 4-12-40-F1 thermoelectric cooling element.

Provided between the semiconductor thermoelectric module 40 and the microprocessor 10 are three elements to enhance thermal conduction from the microprocessor 10 to the semiconductor thermoelectric module 40, and specifically the three elements include the first metallic filler layer 20, the first metal plate 30, and a second metallic filler layer 22.

As noted above, the applicants of the present invention recognized that when microprocessors output heat the heat is not generally output uniformly from the top surface of the microprocessor. That is, the present inventors recognized that a top surface of a microprocessor generates small isolated hot spots where intense heat is built up, rather than having a uniform dissipation of heat from a top surface of the microprocessor. To more effectively utilize the semiconductor thermoelectric module 40, prior to heat being conducted from the microprocessor 10 to the semiconductor thermoelectric module 40, the cooling device of the present invention utilizes a heat conduction system to spread out the heat from the smaller hot spots on the upper surface of the microprocessor 10.

In the further embodiment of FIGS. 2(a), 2(b) a second metallic filler layer 22 thermally contacts the semiconductor thermoelectric module 40. The second metallic filler layer 22 can be formed of the same material and to serve the same purpose as the first metallic filler layer 20, namely to increase thermal conductivity and to spread out received heat more evenly.

The first metal plate 30 and the second metallic filler layer 22 preferably have a greater surface area than that of the first metallic filler layer 20 to spread out heat to the semiconductor thermoelectric module 40, which is preferably larger in surface area than the microprocessor 10.

With the above-noted structure the first metallic filler layer 20, the first metal plate 30, and the second metallic filler layer 22 serve to spread out the heat generated at the isolated hot spots on the top surface of the microprocessor 10 and to provide such spread out heat to the semiconductor thermoelectric module 40. That allows the semiconductor thermoelectric module 40 to be much more effective in its cooling operation.

In the present invention the upper surface of the semiconductor thermoelectric module 40 can directly contact an outer surface of a device in which the microprocessor 10 is utilized, such as the outer surface or casing of a laptop computer. However, to be even more effective in conducting heat provided between the semiconductor thermoelectric module 40 and the casing of a device such as a laptop computer a further thermoelectric conductive layer structure can be provided.

As seen in FIGS. 2(a) and 2(b), provided on the shown upper surface of the semiconductor thermoelectric module 40 can be a third metallic filler layer 24 and a second metal plate 32. The third metallic filler layer 24 and the second metal plate 32 can serve to further dissipate heat and spread out heat from the semiconductor thermoelectric module 40 in the same manner as the first metallic filler layer 20, the first metal plate 30, and the second metallic filler layer 22. Further, the third metallic filler layer 24 and the second metal plate 32 can be formed of the same materials respectively as the first metallic filler layer 20 and the first metal plate 30, and the first, second, and third metallic filler layers 20, 22, 24 can also be formed of the same material.

One or both of the first and second metal plates 30 and 32 can be formed of any material having a large thermal conductivity, such as aluminum (with a thermal conductivity of 210 W/m° K.) or copper (with a thermal conductivity of 390 W/m° K.), and other similar type materials.

The material of any or all of the first, second, and third metallic filler layers 20, 22, and 24 can be of alloys with low melting temperature and high thermal conductivity, i.e. are molten metal conductive layers. For example, one usable alloy having a melting temperature of 45° C. can be formed as follows:

| | |
|---|---|
| Sn | 21.1%; |
| Bi | 50%; |
| Pb | 20.5%; and |
| Cd | 8.4%. |

Another alloy having a melting temperature of 60.5° C. that can be utilized can be formed as follows:

| | |
|---|---|
| Sn | 12.5%; |
| Bi | 50%; |
| Pb | 25%; and |
| Cd | 12.5%. |

Another alloy having a melting temperature at 70° C. that can be utilized can be formed as follows:

| | |
|---|---|
| Sn | 12.9%; |
| Bi | 49.4%; |
| Pb | 27.7%; and |
| Cd | 10%. |

In such ways, the novel cooling system disclosed above can provide enhanced cooling of an element such as a microprocessor. Further enhanced cooling can be realized by utilizing a semiconductor thermoelectric module that can allow fixing a specified temperature range with a control, with providing a cooling module that has small overall dimensions, and with providing a cooling module that has no moving parts and thus has increased reliability.

FIGS. 3(a) to 3(i) show a process for manufacturing the novel cooling system of the present invention.

Figure 3A:
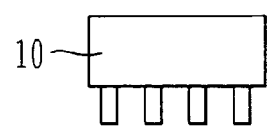
FIGS. 3(a) to 3(i) show a process of manufacturing the novel cooling systems of the present invention.
Figure 3B:
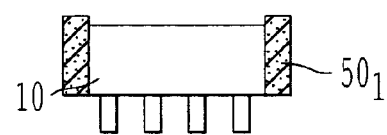
Figure 3C:
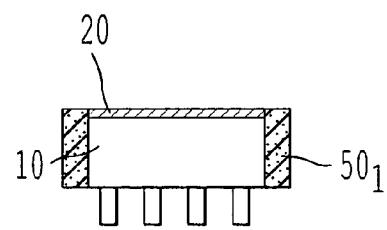
Figure 3D:
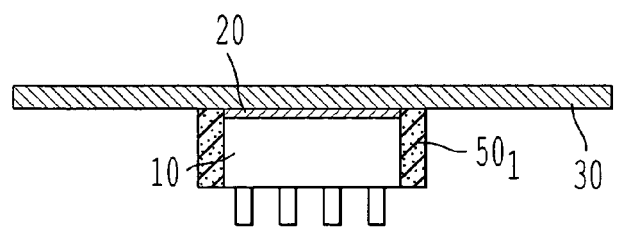

As shown in FIG. 3(a), an element to be cooled is provided, i.e., in this disclosed embodiment the microprocessor 10 is provided. In a next operation shown in FIG. 3(b) the first rubber frame $50_1$ is provided around edges of the microprocessor 10. Then, as shown in FIG. 3(c), the first metallic filler layer 20 is provided to cover and be in thermal contact with the entire top surface of the microprocessor 10. Then, as shown in FIG. 3(d), the first metal plate 30 is provided to cover and to be in thermal contact with the first metallic filler layer 20.

With the operations shown in FIGS. 3(a)–3(d) the structure shown in FIG. 1, with the exception of the plastic clamp 60, is realized. As shown in FIG. 1, the device in FIG. 3(d) can then be directly put in contact with an outer surface 80 of a computer.

Figure 3E:
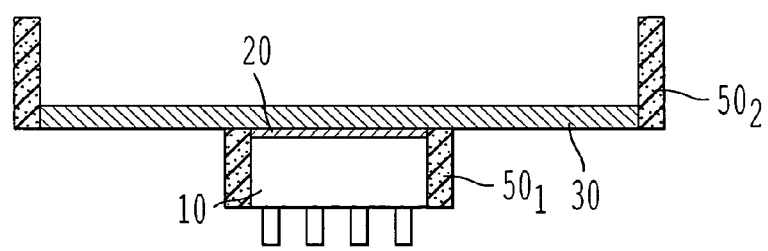
Figure 3F:
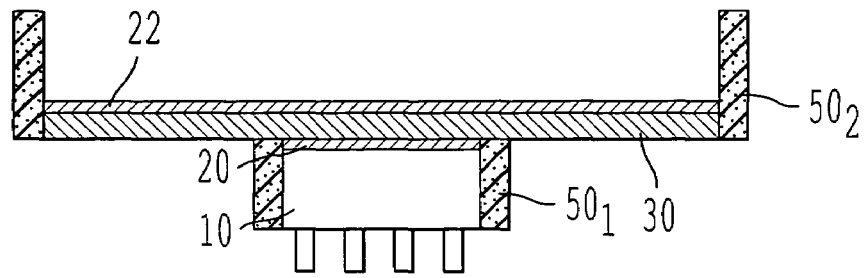
Figure 3G:
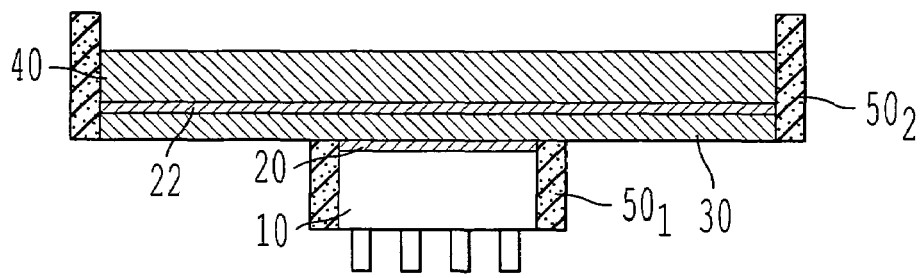
Figure 3H:
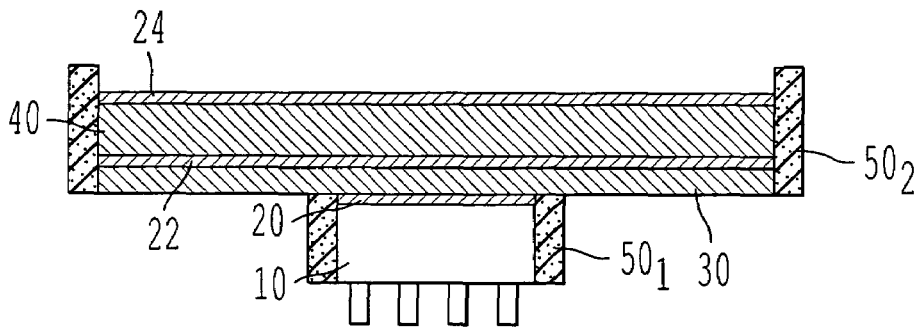

However, to realize the enhanced device of FIG. 2(a), the manufacturing process then proceeds to an operation shown in FIG. 3(e). As shown in FIG. 3(e) the second rubber frame $50_2$ is then provided to surround the first metal plate 30. Then, as shown in FIG. 3(f), the second metallic filler layer 22 is provided to cover and to be in thermal contact with the entire surface of the first metal plate 30. Then, as shown in FIG. 3(g), the semiconductor thermoelectric module 40 is provided to be in contact and in thermal contact with the second metallic filler layer 22. Then, as shown in FIG. 3(h), the third metallic filler layer 24 is provided to cover an entire surface of and to be in thermal contact with the semiconductor thermoelectric module 40. Then, as shown in FIG. 3(i), the second metallic plate 32 is provided to cover and to be in thermal contact with the third metallic filler layer 24.

Figure 3I:
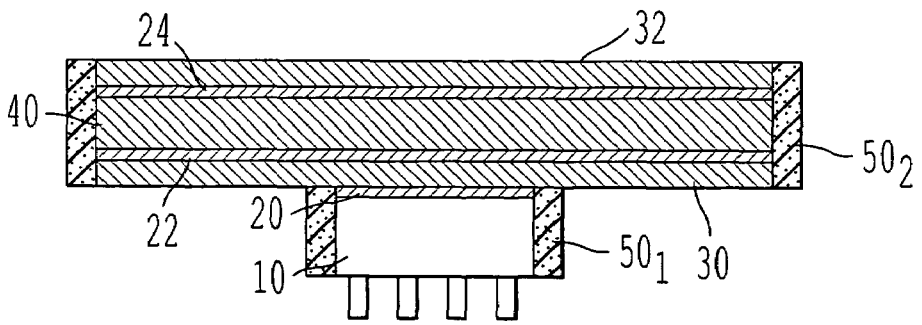

The resulting structure shown in FIG. 3(i) can then be applied against an outer casing 80 of a computer, after being held in place with a clamp 60, to realize the structure shown in FIGS. 2(a), 2(b).

In such ways, the operations shown in FIGS. 3(a)–3(i) can realize the novel cooling devices shown in both FIG. 1 and FIG. 2(a).

Obviously, numerous additional modifications and variations of the present invention are possible in light of the above teachings. It is therefore to be understood that within the scope of the appended claims, the present invention may be practiced otherwise than as specifically described herein.

The invention claimed is:

1. A cooling device comprising:
    an element to be cooled and including a surface outputting heat;
    a first metallic filler layer configured to cover and to be in thermal conductive contact with an entire portion of said surface of said element outputting heat;
    a first metal plate covering and in thermal conductive contact with a surface of said first metallic filler layer, the first metal plate having a greater area than an area of said first metallic filler layer;
    a second metallic filler layer in thermal conductive contact with said first metal plate; and
    a semiconductor thermoelectric module in thermal conductive contact with said second metallic filler layer.

2. A cooling device according to claim 1, further comprising:
    a third metallic filler layer in thermal conductive contact with said semiconductor thermoelectric module; and
    a second metal plate in thermal conductive contact with said third metallic filler layer.

3. A cooling device according to claim 2, wherein said second and third metallic filler layers cover entire surfaces of said semiconductor thermoelectric module.

4. A cooling device according to claim 1, wherein said element to be cooled is an integrated circuit chip.

5. A cooling device according to claim 2, wherein said element to be cooled is an integrated circuit chip.

6. A cooling device comprising:
    an element to be cooled and including a surface outputting heat;
    a first metallic filler layer configured to cover and to be in thermal conductive contact with an entire portion of said surface of said element outputting heat;
    a first metal plate covering and in thermal conductive contact with a surface of said first metallic filler layer, the first metal plate having a greater area than an area of said first metallic filler layer;
    wherein said first metallic filler layer is formed of an alloy of:

| | |
|---|---|
| Sn | 21.1%, |
| Bi | 50%, |
| Pb | 20.5%, and |
| Cd | 8.4%. |

7. A cooling device according to claim 2, wherein at least one of said first, second, and third metallic filler layers is formed of an alloy of:

| | |
|---|---|
| Sn | 21.1%, |
| Bi | 50%, |
| Pb | 20.5%, and |
| Cd | 8.4%. |

8. A cooling device comprising:
an element to be cooled and including a surface outputting heat;
a first metallic filler layer configured to cover and to be in thermal conductive contact with an entire portion of said surface of said element outputting heat;
a first metal plate covering and in thermal conductive contact with a surface of said first metallic filler layer, the first metal plate having a greater area than an area of said first metallic filler layer;
wherein said first metallic filler layer is formed of an alloy of:

| | |
|---|---|
| Sn | 12.5%, |
| Bi | 50%, |
| Pb | 25%, and |
| Cd | 12.5%. |

9. A cooling device according to claim 2, wherein at least one of said first, second, and third metallic filler layers is formed of an alloy of:

| | |
|---|---|
| Sn | 12.5%, |
| Bi | 50%, |
| Pb | 25%, and |
| Cd | 12.5%. |

10. A cooling device comprising:
an element to be cooled and including a surface outputting heat;
a first metallic filler layer configured to cover and to be in thermal conductive contact with an entire portion of said surface of said element outputting heat;
a first metal plate covering and in thermal conductive contact with a surface of said first metallic filler layer, the first metal plate having a greater area than an area of said first metallic filler layer;
wherein said first metallic filler layer is formed of an alloy of:

| | |
|---|---|
| Sn | 12.9%, |
| Bi | 49.4%, |
| Pb | 27.7%, and |
| Cd | 10%. |

11. A cooling device according to claim 2, wherein at least one of said first, second, and third metallic filler layers is formed of an alloy of:

| | |
|---|---|
| Sn | 12.9%, |
| Bi | 49.4%, |
| Pb | 27.7%, and |
| Cd | 10%. |

12. A cooling device according to claim 1, wherein said first metal plate is formed of at least one of aluminum or copper.

13. A cooling device according to claim 2, wherein at least one of said first and second metal plates is formed of at least one of aluminum or copper.

14. A cooling device according to claim 2, wherein said semiconductor thermoelectric module is a Peltier element.

15. A cooling device according to claim 6, wherein said element to be cooled is an integrated circuit chip.

16. A cooling device according to claim 7, wherein said element to be cooled is an integrated circuit chip.

17. A cooling device according to claim 8, wherein said element to be cooled is an integrated circuit chip.

18. A cooling device according to claim 9, wherein said element to be cooled is an integrated circuit chip.

19. A cooling device according to claim 10, wherein said element to be cooled is an integrated circuit chip.

20. A cooling device according to claim 11, wherein said element to be cooled is an integrated circuit chip.

21. A process for manufacturing a cooling device comprising:
providing an element to be cooled and including a surface outputting heat;
providing a first metallic filler layer to cover and to be in thermal conductive contact with an entire portion of said surface of said element outputting heat;
providing a first metal plate to cover and to be in thermal conductive contact with a surface of said first metallic filler layer, the first metal plate having a greater area than an area of said first metallic filler layer;
providing a second metallic filler layer in thermal conductive contact with said first metal plate; and
providing a semiconductor thermoelectric module in thermal conductive contact with said second metallic filler layer.

22. A process for manufacturing a cooling device according to claim 21, further comprising:
providing a third metallic filler layer in thermal conductive contact with said semiconductor thermoelectric module; and
providing a second metal plate in thermal conductive contact with said third metallic filler layer.

23. A process for manufacturing a cooling device according to claim 22, wherein said second and third metallic filler layers cover entire surfaces of said semiconductor thermoelectric module.

24. A process for manufacturing a cooling device according to claim 21, wherein said element to be cooled is an integrated circuit chip.

25. A process for manufacturing a cooling device according to claim 22, wherein said element to be cooled is an integrated circuit chip.

26. A process for manufacturing a cooling device comprising:
providing an element to be cooled and including a surface outputting heat;
providing a first metallic filler layer to cover and to be in thermal conductive contact with an entire portion of said surface of said element outputting heat;
providing a first metal plate to cover and to be in thermal conductive contact with a surface of said first metallic filler layer, the first metal plate having a greater area than an area of said first metallic filler layer;

wherein said first metallic filler layer is formed of an alloy of

| | | |
|---|---|---|
| Sn | 21.1%, | |
| Bi | 50%, | |
| Pb | 20.5%, and | |
| Cd | 8.4%. | |

27. A process for manufacturing a cooling device according to claim 22, wherein at least one of said first, second, and third metallic filler layers is formed of an alloy of

| | | |
|---|---|---|
| Sn | 21.1%, | |
| Bi | 50%, | |
| Pb | 20.5%, and | |
| Cd | 8.4%. | |

28. A process for manufacturing a cooling device comprising:
providing an element to be cooled and including a surface outputting heat;
providing a first metallic filler layer to cover and to be in thermal conductive contact with an entire portion of said surface of said element outputting heat;
providing a first metal plate to cover and to be in thermal conductive contact with a surface of said first metallic filler layer, the first metal plate having a greater area than an area of said first metallic filler layer;
wherein said first metallic filler layer is formed of an alloy of

| | | |
|---|---|---|
| Sn | 12.5%, | |
| Bi | 50%, | |
| Pb | 25%, and | |
| Cd | 12.5%. | |

29. A process for manufacturing a cooling device according to claim 22, wherein at least one of said first, second, and third metallic filler layers is formed of an alloy of

| | | |
|---|---|---|
| Sn | 12.5%, | |
| Bi | 50%, | |
| Pb | 25%, and | |
| Cd | 12.5%. | |

30. A process for manufacturing a cooling device comprising:
providing an element to be cooled and including a surface outputting heat;
providing a first metallic filler layer to cover and to be in thermal conductive contact with an entire portion of said surface of said element outputting heat;
providing a first metal plate to cover and to be in thermal conductive contact with a surface of said first metallic filler layer, the first metal plate having a greater area than an area of said first metallic filler layer;
wherein said first metallic filler layer is formed of an alloy of

| | | |
|---|---|---|
| Sn | 12.9%, | |
| Bi | 49.4%, | |
| Pb | 27.7%, and | |
| Cd | 10%. | |

31. A process for manufacturing a cooling device according to claim 22, wherein at least one of said first, second, and third metallic filler layers is formed of an alloy of

| | | |
|---|---|---|
| Sn | 12.9%, | |
| Bi | 49.4%, | |
| Pb | 27.7%, and | |
| Cd | 10%. | |

32. A process for manufacturing a cooling device according to claim 21, wherein said first metal plate is formed of at least one of aluminum or copper.

33. A process for manufacturing a cooling device according to claim 22, wherein at least one of said first and second metal plates is formed of at least one of aluminum or copper.

34. A process for manufacturing a cooling device according to claim 22, wherein said semiconductor thermoelectric module is a peltier element.

35. A process for manufacturing a cooling device according to claim 26, wherein said element to be cooled is an integrated circuit chip.

36. A process for manufacturing a cooling device according to claim 27, wherein said element to be cooled is an integrated circuit chip.

37. A process for manufacturing a cooling device according to claim 28, wherein said element to be cooled is an integrated circuit chip.

38. A process for manufacturing a cooling device according to claim 29, wherein said element to be cooled is an integrated circuit chip.

39. A process for manufacturing a cooling device according to claim 30, wherein said element to be cooled is an integrated circuit chip.

40. A process for manufacturing a cooling device according to claim 31, wherein said element to be cooled is an integrated circuit chip.

* * * * *